(12) United States Patent
Sander

(10) Patent No.: US 9,429,598 B2
(45) Date of Patent: Aug. 30, 2016

(54) CURRENT MEASUREMENT AND CONTROL OF A SEMICONDUCTOR ELEMENT BASED ON THE CURRENT MEASUREMENT IN A POWER SEMICONDUCTOR ARRANGEMENT

(71) Applicant: Infineon Technologies AG, Neubiberg (DE)

(72) Inventor: Rainald Sander, Munich (DE)

(73) Assignee: Infineon Technologies AG, Neubiberg (DE)

( * ) Notice: Subject to any disclaimer, the term of this patent is extended or adjusted under 35 U.S.C. 154(b) by 102 days.

(21) Appl. No.: 14/320,143

(22) Filed: Jun. 30, 2014

(65) Prior Publication Data

US 2015/0377931 A1    Dec. 31, 2015

(51) Int. Cl.
*G01R 19/00* (2006.01)
*G01R 31/26* (2014.01)

(52) U.S. Cl.
CPC ....... *G01R 19/0092* (2013.01); *G01R 31/2639* (2013.01)

(58) Field of Classification Search
CPC ............... H01L 2924/3011; H01L 29/0634; H02M 7/53871; H02M 2001/0032; H02M 3/156; H02M 3/1584; H02M 3/3385; H02M 7/53803; G01R 19/0092; G01R 31/2621; G01R 31/40; G01R 1/20; G01R 15/08; G01R 31/28; G01R 31/2851; G01R 31/3004; H02H 3/006; H02H 3/08; H02H 9/02; G01K 7/00; G05F 1/573; G05F 1/575; G05F 3/262; H02P 8/12; H02P 7/288
See application file for complete search history.

(56) References Cited

U.S. PATENT DOCUMENTS

| 5,287,055 | A | * | 2/1994 | Cini | G01R 31/2644 324/123 R |
| 5,325,258 | A | * | 6/1994 | Choi | H03K 17/0828 323/276 |
| 2005/0231177 | A1 | * | 10/2005 | Tateno | H02M 3/1588 323/225 |
| 2006/0181289 | A1 | * | 8/2006 | Deboy | G01R 19/0092 324/713 |
| 2012/0286805 | A1 | * | 11/2012 | Maurath | G01R 31/40 324/649 |

FOREIGN PATENT DOCUMENTS

DE    10343083 A1    4/2005

* cited by examiner

*Primary Examiner* — Vinh Nguyen
(74) *Attorney, Agent, or Firm* — Shumaker & Sieffert, P.A.

(57) ABSTRACT

A semiconductor arrangement may include a multiplicity of semiconductor elements with controlling paths and controlled paths, the controlled paths having controllable conductivities and being connected parallel to each other. The semiconductor arrangement may also include a current evaluation circuit configured to measure current strengths of currents present in the controlled paths and to provide a signal representing the sum of the measured current strengths, and a control circuit connected to the controlling paths and configured to control the conductivities of the controlled paths in accordance with an input signal and the signal representing the sum of the current strengths. The at least one controlled path is controlled to have minimum conductivity if the signal representing the sum of the current strengths is below a threshold value.

24 Claims, 4 Drawing Sheets

CURRENT MEASUREMENT AND CONTROL OF A SEMICONDUCTOR ELEMENT BASED ON THE CURRENT MEASUREMENT IN A POWER SEMICONDUCTOR ARRANGEMENT

TECHNICAL FIELD

The disclosure relates to power semiconductor arrangements with a current measurement circuit and to methods for measuring the current in a power semi-conductor arrangement.

BACKGROUND

Power semiconductors such as power transistors are widely used for switching electrical currents in automotive or industrial applications. For example, power transistors can be employed in any kind of switched-mode power supply, in drive circuits for driving loads such as lamps, inductive valves or motors and in inverters or the like. In order to regulate the current through the load or to simply detect an overload scenario, it is desired in many applications to measure the current flowing through the transistors.

Different concepts are known for measuring a load current through a transistor. These concepts include, among others, using a Hall sensor, using an inductive current sensor or connecting a shunt resistor in series with the load path of the transistor and measuring the voltage across the resistor.

Power semiconductors usually include a plurality of identical semiconductor elements (such as transistor cells) connected in parallel. According to a further concept, at least one of these transistor cells (a sense cell) is used to measure the current through the other transistors cells (load cells) of the transistor. The sense cell is operated in the same operation point as the load cells (but only the current through the sense cell is measured) so that the current through the sense cell is proportional to the overall load current through the load cells. The proportionality factor is the ratio between the number of sense cells and the number of load cells.

There is a need to accurately measure the current through a power transistor with low measuring losses.

SUMMARY

A semiconductor arrangement includes a multiplicity of semiconductor elements with controlling paths and controlled paths, the controlled paths having controllable conductivities and being connected parallel to each other. A current evaluation circuit is configured to measure strengths of currents present in the controlled paths and to provide a signal representing the sum of the measured current strengths. A control circuit is connected to the controlling paths and is configured to control the conductivities of the controlled paths in accordance with an input signal, the signal representing the sum of the current strengths, wherein at least one controlled path is controlled to have minimum conductivity if the signal representing the sum of the current strengths is below a threshold value.

Another semiconductor arrangement includes a semiconductor element with a controlling path and a controlled path, the controlled path having a controllable conductivity. A current evaluation circuit is configured to measure the strength of a current present in the controlled path and to provide a signal representing the measured current strength, wherein the current evaluation circuit comprises at least one shunt resistor that provides a resistance and is connected in series with the controlled path and wherein a voltage over the at least one shunt resistor represents the current present in the controlled path. The current evaluation circuit evaluates a voltage over the at least one shunt resistor and a control circuit configured to control, in accordance with the signal representing the current strength, the resistance provided by the at least one shunt resistor.

A method is configured to measure the current through a semiconductor arrangement that comprises a multiplicity of semiconductor elements with controlling paths and controlled paths. The controlled paths have controllable conductivities and are connected parallel to each other. The method includes measuring strengths of currents present in the controlled paths and providing a signal that represents the sum of the measured current strengths. The method further includes controlling the conductivities of the controlled paths in accordance with an input signal and a signal representing the sum of the current strengths, wherein at least one controlled path is controlled to have minimum conductivity if the signal representing the sum of the current strengths is below a threshold value.

Another method is configured to measure the current through a semiconductor arrangement that comprises a semiconductor element with a controlling path and a controlled path. The controlled path has a controllable conductivity, wherein at least one shunt resistor provides a resistance and is connected in series with the controlled path. A voltage over the at least one shunt resistor represents the current present in the controlled path. The method includes measuring the strength of a current present in the controlled path, providing a signal that represents the measured current strength by evaluating a voltage over the at least one shunt resistor and controlling, in accordance with the signal representing the current strength, the resistance provided by the at least one shunt resistor.

DETAILED DESCRIPTION

Figure 1:
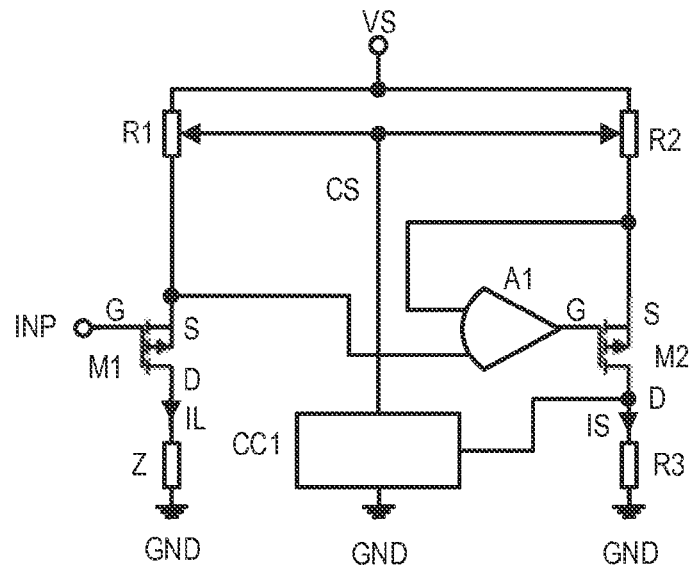
FIG. 1 is a schematic diagram of a power semiconductor arrangement for switching a current through a load.

In the following detailed description, reference is made to the accompanying drawings, which form a part thereof, and in which is shown, by way of illustration, specific embodiments in which the invention may be practiced. In this regard, directional terminology such as top, bottom, front, back, leading, trailing, etc. is used with reference to the orientation of the figures being described. As elements can be positioned in a number of different orientations, the directional terminology is used for purposes of illustration and is in no way limiting. It is to be understood that other embodiments may be utilized, and structural or logical changes may be made without departing from the scope of the present invention. The following detailed description is therefore not to be taken in a limiting sense, and the scope of the present invention is defined by the appended claims. It is to be understood that the features of the various exemplary embodiments described herein may be combined with each other unless specifically noted otherwise. The drawings are not to scale. In the drawings, the same reference characters denote like elements.

FIG. 1 schematically illustrates an exemplary power transistor M1 being used as an electronic switch to switch load Z to a supply voltage to generate load current IL, which flows through load Z. Load Z can be any kind of electric load, such as an inductive load, a resistive load, a capacitive load or a combination thereof. Load Z may include a complex electronic circuit with a plurality of electronic devices and may include further power transistors. In the exemplary arrangement shown in FIG. 1, power transistor M1 is implemented as a MOSFET, specifically as a p-type depletion MOSFET. However, this is only for illustration purposes. Power transistors used as electronic switches do not necessarily have to be p-type MOSFETs or depletion MOSFETs. Other types of MOSFETs, such as n-type MOSFETs, IGBTs (insulated gate bipolar transistors), power JFETs (junction field-effect transistors) or power BJTs (bipolar junction transistors), can be used instead.

Power transistor M1 is connected as a high-side switch, which means that it is connected between load Z and a terminal for a high-side potential such as supply potential VS. Power transistor M1 has a controlling path (e.g., a control terminal), two load terminals and a controlled path between the two load terminals, wherein gate terminal G is the control terminal, drain terminal D is one load terminal, source terminal S is the other load terminal and a drain source path is the controlled path. In order for load current IL to flow through load Z, the load path of power transistor M1 is connected in series with load Z between the terminals for high-side (positive) supply potential VS and low-side (negative) supply potential GND. Power transistor M1 can be switched on and off by applying a suitable drive voltage between control terminal G and load terminal S. Input signal INP is supplied to gate terminal G to control the conductivity of the semiconductor arrangement (e.g., to switch the semiconductor arrangement on or off).

A current evaluation circuit measures the strength of the current present in the controlled path, i.e., load current IL, and provides a signal representing the strength of load current L. The current evaluation circuit includes resistor R1, which is connected between supply potential VS and source terminal S of power transistor M1. The voltage present at resistor R1 is supplied to one input of operational amplifier A1, whose other input is connected to supply potential VS via resistor R2. A node between resistor R2 and the other input of operational amplifier A1 is connected to source terminal S of transistor M2, whose gate terminal G is coupled to the output of operational amplifier A1 and whose drain terminal D is connected to reference potential GND via resistor R3. In the exemplary arrangement shown in FIG. 1, transistor M2 is implemented as a MOSFET, specifically as p-type depletion MOSFET. However, any other type of transistor is applicable as well.

Resistor R1, resistor R2, operational amplifier A1 and transistor M2 form a specific type of current mirror, but any other type of current mirror can be used. Any current mirror provides output current IS (to resistor R3, which transforms current IS in a corresponding voltage), which represents load current IL according to $$IL = k \cdot IS,$$

wherein $k \neq 0$.

In the current mirror shown in FIG. 1, k can be expressed as $$k = IL/IS = R2/R1.$$

Resistor R1, which is also referred to as a shunt resistor, may be provided by a bonding wire and have, for example, a resistance of 1 ohm, while resistor R2 may be configured to have a resistance of 10 ohms so that k would be 10,000. As can be seen, at smaller load currents IL, the voltage at resistor R1 (which is $R1 \cdot IL$) can be very small, and noise present at the inputs of operational amplifier A1 may hinder or even render impossible current evaluations of smaller load currents IL. The resistance of resistor R1 may be increased so that smaller load currents IL also generate sufficient voltages at resistor R1. However, higher resistances of resistor R1 lead to an unwanted increase of power consumption by resistor R1. At larger load currents IL, this power consumption by resistor R1 may cause significant efficiency and heat problems.

In the current mirror shown in FIG. 1, resistors R1 and R2 are designed to be controllable by control signal CS so that the resistance provided by resistor R1 is adapted to the strength of load current IL; i.e., the resistance of resistor R1 is higher at smaller load currents IL and lower at larger load currents IL. In order to provide linear output current IS, the resistance of resistor R2 is adapted to the variable resistance of resistor R1, which is a function of load current IL according to $$R2 = k \cdot R1(IL).$$

Control signal CS may be provided by control circuit CC1, which is configured to control, in accordance with a signal representing the strength of load current IL, e.g., current IS or the corresponding voltage over resistor R3, the resistance of resistor R1 or, accordingly, the resistance of resistor R2. Alternatively, instead of the measured load current IL, load Z or estimates of load current IL and/or load Z may form the basis for control signal CS. The resistance of resistors R1 and R2 may be changed, for example, by connecting a number of resistors in parallel and/or in series, wherein the number may depend on load current IL.

Figure 2:
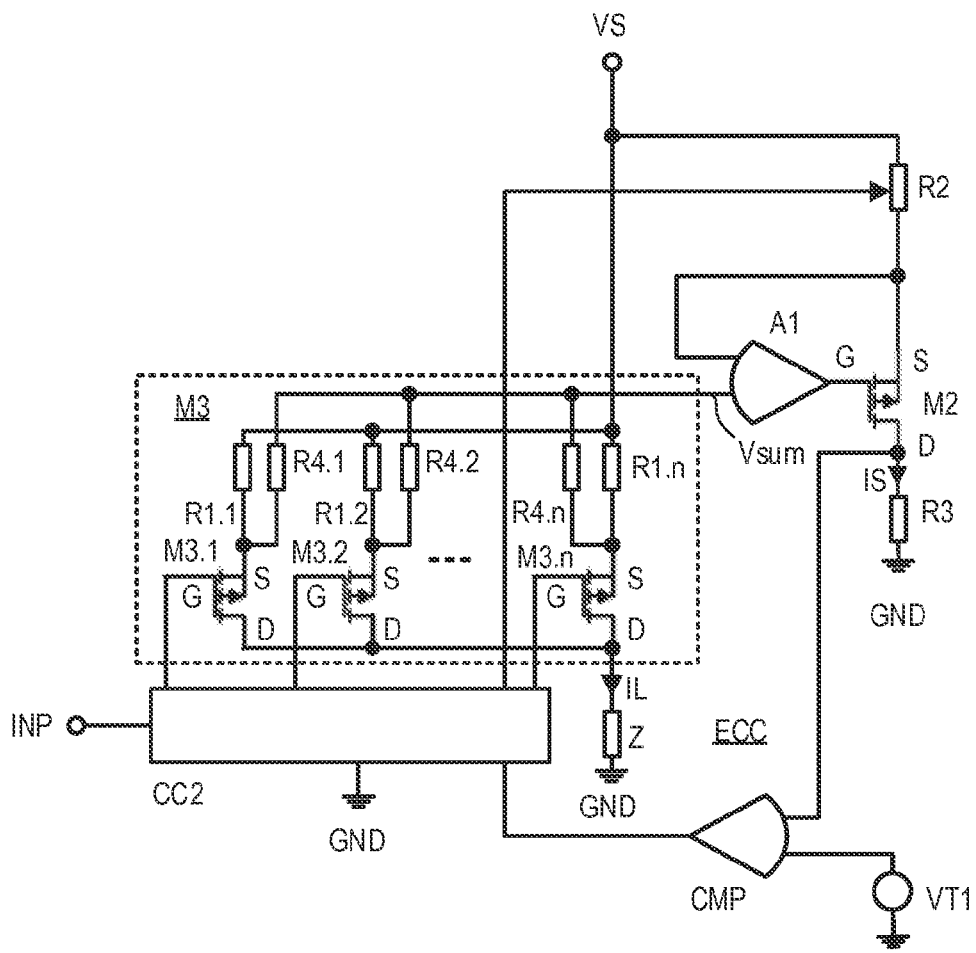
FIG. 2 is a schematic diagram of a power semiconductor arrangement for high-side switching a current through a load with a multi-cell p-channel load transistor, a drive control circuit and a measurement circuit.

Referring to FIG. 2, power transistor M3, which has n transistor elements M3.1-M3.n that have controlling paths (e.g., gate terminals G) and controlled paths (e.g., the path between source terminal S and drain terminal D), may be employed, wherein the controlled paths have controllable conductivities and are connected parallel to each other between supply voltage VS and load Z. Furthermore, n resistor elements R1.1-R1.n are connected between source terminals S of the n transistor elements M3.1-M3.n and supply voltage VS. In the present example, the n resistor elements R1.1-R1.n have the same resistance R so that when all n resistor elements R1.1-R1.n are connected in parallel, i.e., when all transistor elements M3.1-M3.n are switched on (and thus have their maximum conductivity), the resulting resistor R1 can be expressed as follows:

$$1/R1 = 1/R1.1 + 1/R1.2 + \ldots 1/R1.n = n/R,$$

which is $R1 = R/n$.

If no all transistor elements M3.1-M3.n are switched on, the resistance of resistor R1 is different. For example, if only n−1 transistor elements are switched on, the resulting resistance of resistor R1 is R1=R/(n−1), or, in general, R1=R/j when j transistors are switched on, wherein 0<j≤n.

In order to evaluate load current IL, which flows through transistor elements M3.1-M3.n connected in parallel, the voltages present at transistor elements M3.1-M3.n may be summed up. If a particular transistor element is switched off (minimum connectivity), the voltage at the corresponding resistor element is zero and thus does not contribute to the sum, Summing may be performed by way of resistor elements R4.1-R4.n, which may have the same resistance, wherein the resistance of resistor elements R4.1-R4.n may be much higher than the resistance of resistor elements R1.1-R1.n. Resistor elements R4.1-R4.n are connected between source terminals S of transistor elements M3.1-M3.n and the other input of operational amplifier A1 to provide sum signal Vsum to operational amplifier A1. Operational amplifier A1, resistor R2, transistor M2 and resistor R3 are connected in the same way as in the arrangement shown in FIG. 1. Load Z is connected between the coupled drain terminals D of transistor elements M3.1-M3.n and reference potential GND. The gate terminals of transistor elements M3.1-M3.n are connected to control circuit CC2, which receives input signal INP and controls resistor R2 to match the resistance of resistor R2 with the resistance of resistor R1.

The voltage at resistor R3, which corresponds to current IS, may be supplied to comparator CMP, which compares the voltage at resistor R3 with threshold voltage VT. If the voltage at resistor R3 (and thus load current IL) falls below the given threshold, at least one of transistor elements M3.1-M3.n is switched off to the effect that the resistance of resistor R1 is increased. The resistance of resistor R2 is adapted by control circuit CC2 to provide linear output current IS. The higher effective resistance of resistor R1 at smaller load currents IL allows for evaluating smaller currents with higher accuracy without requiring additional switches to control the resistance of resistor R1, as the transistor elements already present for general switching purposes are also used to configure the resistance of resistor R1. As no additional switches are required because adding switches would add further resistance to the load path, the efficiency of the switches does not (significantly) deteriorate. At larger load currents IL, all transistor elements are switched on so that the efficiency of the arrangement and the accuracy of the measurement are maximized.

Figure 3:
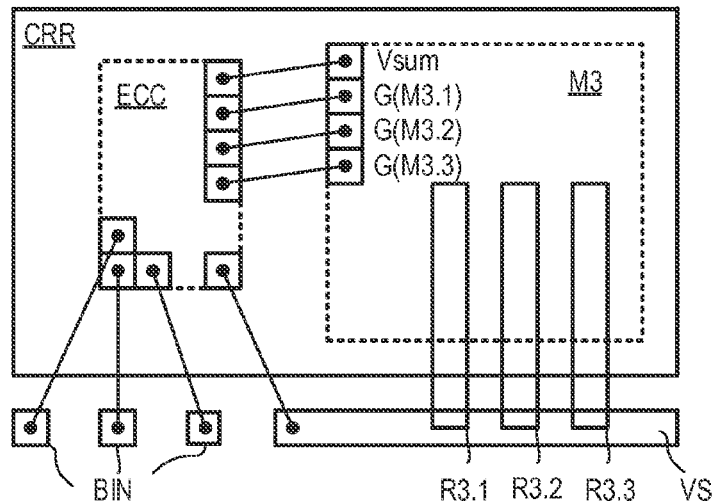
FIG. 3 is a schematic wiring diagram of the exemplary arrangement shown in FIG. 2.

FIG. 3 is a schematic wiring diagram of an exemplary arrangement. Transistor M3, formed by transistor elements M3.1-M3.n (e.g., n=3), may be a vertical structure connected via its rear side drain terminal to electrically conductive carrier CRR (e.g., a conductive carrier of a housing), which may form an output terminal to connect load Z to the drain terminal of transistor M3. Transistor M3 and evaluation and control circuit ECC, which may include control circuit CC2, resistor R2, operational amplifier A1, transistor M2 and comparator CMP, are arranged on carrier CRR. The sources of threshold voltage VT1 and resistor R3 may be external elements not integrated in the housing. In the exemplary arrangement shown in FIG. 3, resistor elements R3.1-R3.3 are implemented as pieces of bonding wire that connect transistor M3 with the supply line for supply potential VS. Evaluation and control circuit ECC may be connected via four bond connections to transistor M3 in order to provide control signals to gates G of transistor elements M3.1-M3.3 of transistor M3 and to receive sum signal Vsum from transistor M3. Evaluation and control circuit ECC may furthermore be connected to contact pads BIN in order to receive various input signals and to supply voltage VS via further bond connections.

Transistor M3 may include a semiconductor structure on or in which a plurality of gates are isolated from each other and are connected to at least two different gate drive lines. A contact layer formed on the semiconductor structure connects a plurality of source and/or body regions of the semiconductor structure. The contacts between the source contact layer and a potential measuring line are arranged below a contact surface, which is formed by a source terminal of the bonding wire on the source contact layer between the source terminal and the bonding wire, as set forth in more detail in German patent DE 103 43 083 B4.

Figure 4:
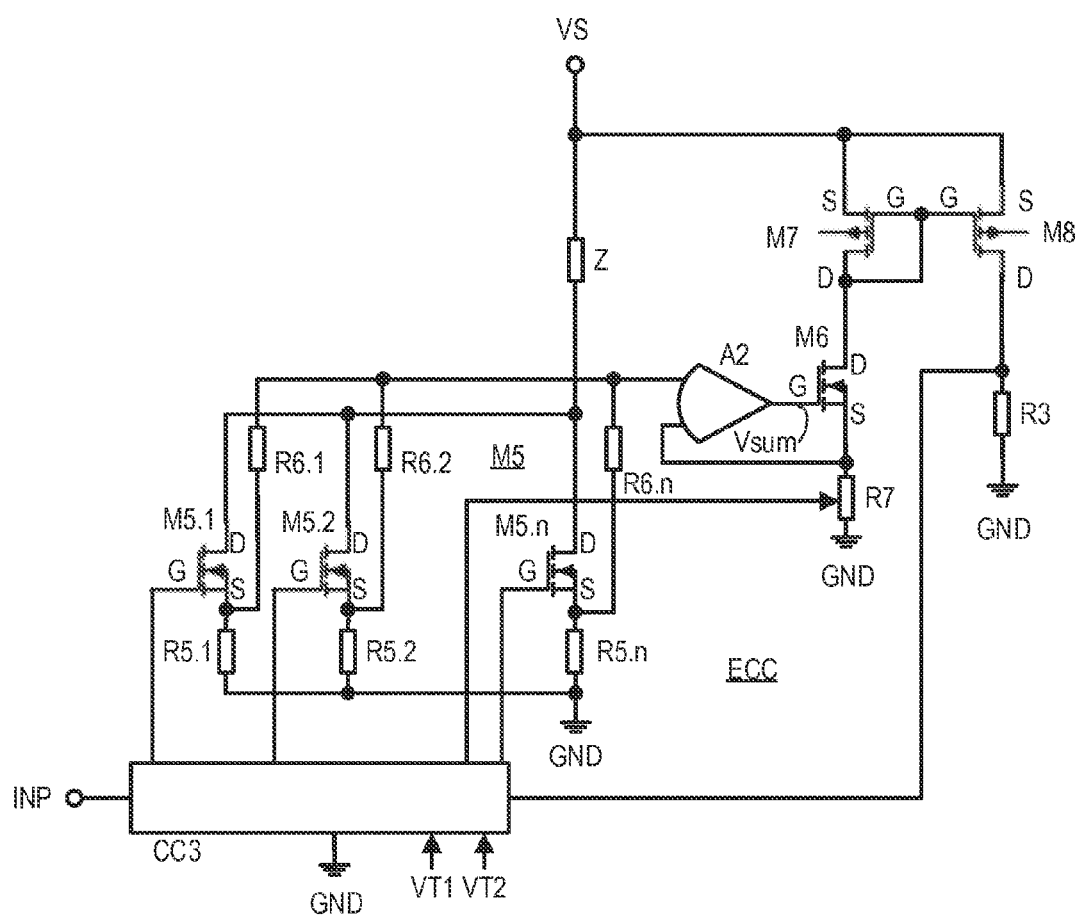
FIG. 4 is a schematic diagram of a power semiconductor arrangement for low-side switching a current through a load with a multi-cell n-channel load transistor, a drive control circuit and a measurement circuit.

Low-side switch structures may be employed instead of the high-side switch structures shown in FIGS. 1 and 2. An exemplary arrangement with a low-side structure and a multiplicity of transistor elements is shown in FIG. 4. Power transistor M5, which may be an n-type depletion MOSFET with n transistor elements M5.1-M5.n that have controlling paths (e.g., gate terminals G) and controlled paths (e.g., a path between source terminal S and drain terminal D), may be employed, wherein the controlled paths have controllable conductivities and are connected parallel to each other between reference potential GND and load Z. Furthermore, n resistor elements R6.1-R6.n are connected between source terminals S of the n transistor elements M5.1-M5.n and reference potential GND. In the present example, the n resistor elements R6.1-R6.n have the same resistance R so that when all n resistor elements R6.1-R6.n are connected in parallel (i.e., when all transistor elements M5.1-M5.n are switched on), the resulting resistor R6 is R/n. If not all transistor elements M5.1-M5.n are switched on, the resistance of resistor R6 is R/j when j transistors are switched on, wherein 0<j≤n.

In order to evaluate load current IL, which flows through transistor elements M5.1-M5.n connected in parallel, the voltages present at transistor elements M5.1-M5.n may again be summed up. If a particular transistor element is switched off, the voltage at the corresponding resistor element is zero and therefore does not contribute to the sum. Summing may be performed by way of resistor elements R6.1-R6.n, which may have the same resistance, wherein the resistance of resistor elements R6.1-R6.n may be much higher than the resistance of resistor elements R5.1-R5.n. Resistor elements R6.1-R6.n are connected between source terminals S of transistor elements M5.1-M5.n and an input of an operational amplifier A2 to provide sum signal Vsum to operational amplifier A2, whose other input is connected to reference potential GND via resistor R7. A node between resistor R7 and the other input of operational amplifier A1 is connected to a source terminal S of a transistor M6, whose gate terminal G is coupled to the output of operational amplifier A2 and whose drain terminal D is connected to drain terminal D of a transistor M7. Gate terminal G of transistor M7 is coupled with gate terminal G of a transistor M8, whose drain terminal D is connected to reference potential GND via resistor R3. The source terminals of transistors M7 and M8 are connected to supply voltage VS. In the exemplary arrangement shown in FIG. 4, transistor M6 is an n-type depletion MOSFET, and transistors M7 and M8 are p-type depletion MOSFETs. Transistors M7 and M8 form another current mirror.

Load Z is connected between the coupled drain terminals D of transistor elements M5.1-M5.n and supply voltage VS.

The gate terminals of transistor elements M5.1-M5.n are connected to a control circuit CC3, which receives input signal INP and controls resistor R7 to adapt the resistance of resistor R7 to the resistance of resistor R5. The voltage at resistor R3, which corresponds to current IS, may be supplied to control circuit CC3, which compares the voltage at resistor R3 with threshold voltages VT1 and VT2. If the voltage at resistor R3 (and thus load current IL) falls below the higher threshold (e.g., threshold VT1), at least one of transistor elements M5.1-M5.n is switched off to the effect that the resistance of resistor R5 is increased. A further increase in the resistance of resistor R5 is achieved when load current IL falls also below a lower threshold (e.g., threshold VT2) and further transistor elements M5.1-M5.n are switched off. The resistance of resistor R7 is adapted by control circuit CC3 to provide linear output current IS throughout the different resistance settings of resistor R5.

The higher effective resistance of resistor R5 at smaller load currents IL allows for evaluating smaller currents with higher accuracy without requiring additional switches to control the resistance of resistor R5, as the transistor elements already present for general switching purposes are also used to configure the resistance of resistor R5. As no additional switches are required because adding switches would add further resistance to the load path the efficiency of the switches does not (significantly) deteriorate. At larger load currents IL, all transistor elements are switched on so that the efficiency of the arrangement and the accuracy of the measurement are maximized.

Figure 5:
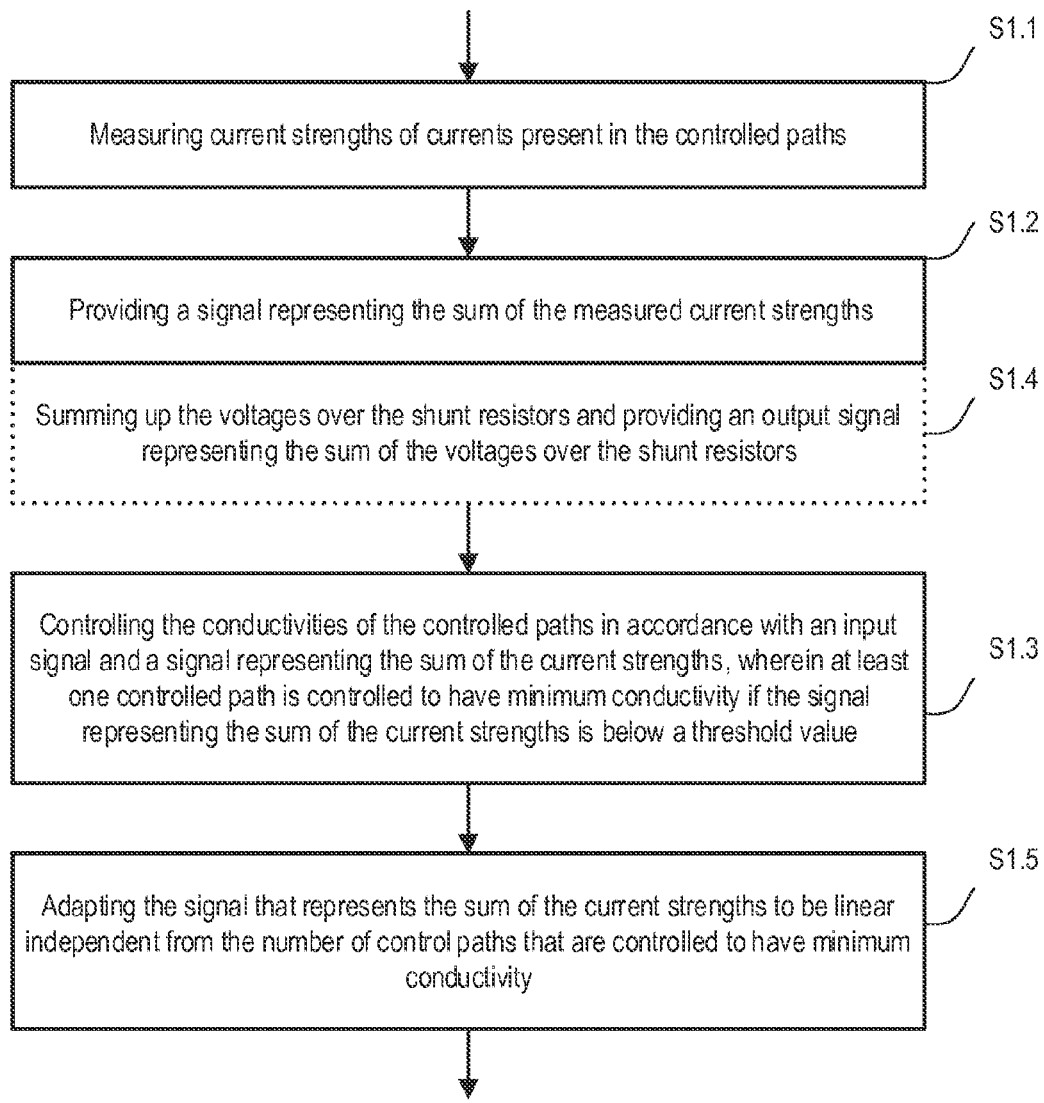
FIG. 5 is a flow chart illustrating a method applied in the arrangements shown in FIG. 1.

FIG. 5 is a flow chart illustrating a method applied in the arrangements shown in FIG. 1. The method includes measuring strengths of currents present in the controlled paths (S1.1), providing a signal representing the sum of the measured current strengths (S1.2) and controlling the conductivities of the controlled paths in accordance with an input signal and a signal representing the sum of the current strengths (S1.3), wherein at least one controlled path is controlled to have minimum conductivity if the signal representing the sum of the current strengths is below a threshold value.

Figure 6:
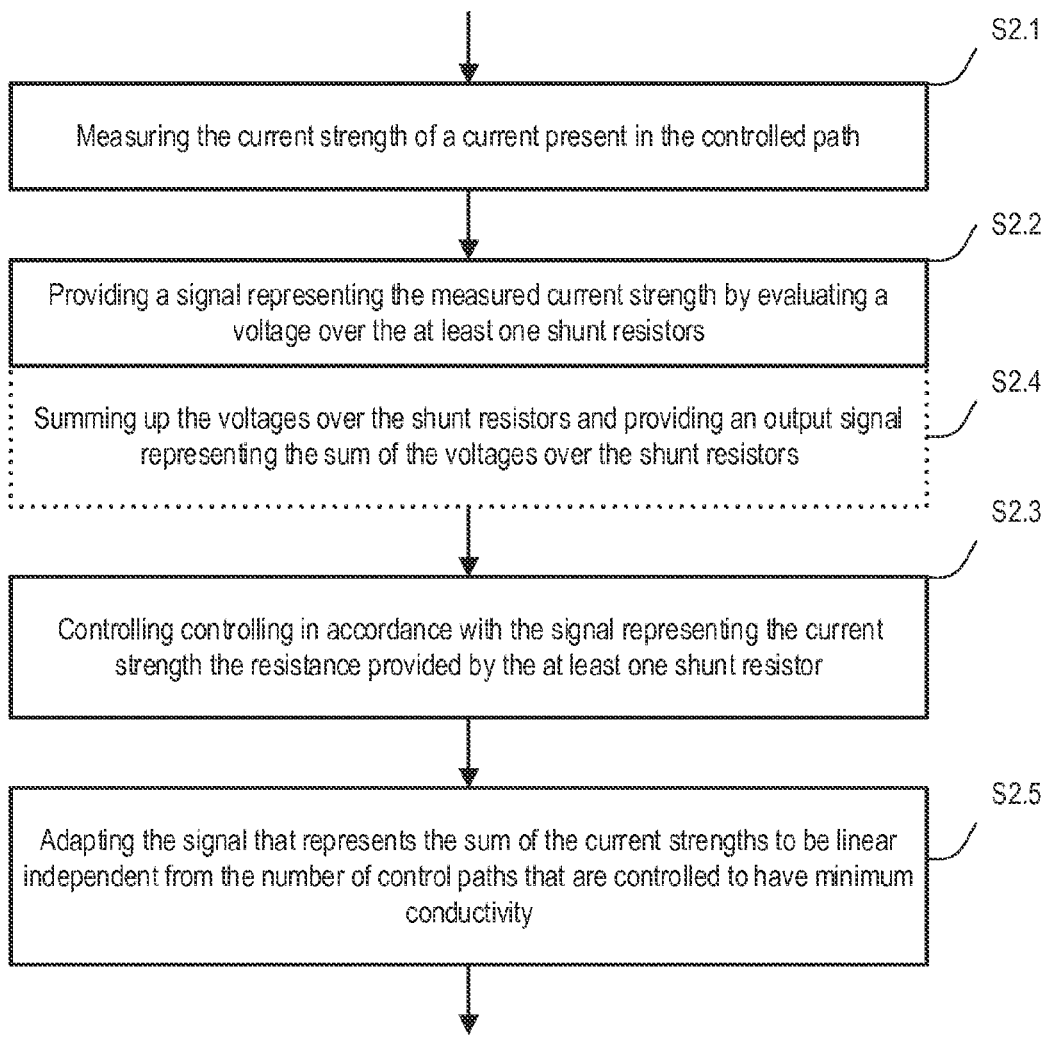
FIG. 6 is a flow chart illustrating a method applied in the arrangements shown in FIGS. 2 and 4.

FIG. 6 is a flow chart illustrating a method applied in the arrangements shown in FIGS. 2 and 4. The method includes measuring the strength of a current present in the controlled path (S2.1), providing a signal representing the measured current strength by evaluating a voltage over the at least one shunt resistor (S2.2), and controlling, in accordance with the signal representing the current strength, the resistance provided by the at least one shunt resistor (S2.3).

In the exemplary methods outlined above, the shunt resistors may be connected in series with switches/semiconductor elements, and the voltages over the shunt resistors represent the currents flowing through the shunt resistors and switches/semiconductor elements. The methods may further include summing up the voltages over the shunt resistors, providing an output signal representing the sum of the voltages over the shunt resistors (S1.4, S2.4) and/or adapting the signal that represents the sum of the current strengths to be linear independent from the number of controlled paths that are controlled to have minimum conductivity (S1.5, S2.5). The methods may further include at least one additional threshold, wherein the number of controlled paths that are controlled to have minimum conductivity is dependent on the number of thresholds that are undercut by the sum of the current strengths.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. A semiconductor arrangement comprising:
    a multiplicity of semiconductor elements with controlling paths and controlled paths, the controlled paths having controllable conductivities and being connected parallel to each other;
    a current evaluation circuit configured to measure current strengths of currents present in the controlled paths and to provide a signal representing the sum of the measured current strengths; and
    a control circuit connected to the controlling paths and configured to control the conductivities of the controlled paths in accordance with an input signal and the signal representing the sum of the current strengths, wherein at least one controlled path is controlled to have minimum conductivity if the signal representing the sum of the current strengths is below a threshold value.

2. The semiconductor arrangement of claim 1, further comprising shunt resistors connected in series with the controlled paths, wherein the voltages at the shunt resistors represent the currents present in the controlled paths and the voltages over the shunt resistors are evaluated by the current evaluation circuit.

3. The semiconductor arrangement of claim 2, wherein the current evaluation circuit is further configured to sum up the voltages over the shunt resistors and to provide an output signal representing the sum of the voltages over the shunt resistors.

4. The semiconductor arrangement of claim 2, wherein the current evaluation circuit comprises a circuit that is configured to adapt the signal that represents the sum of the current strengths to be linear independent from the number of controlled paths that are controlled to have minimum conductivity.

5. The semiconductor arrangement of claim 2, wherein the shunt resistors are pieces of bonding wire.

6. The semiconductor arrangement of claim 1, wherein the threshold value is a first threshold value, wherein the sum of the current strengths is compared to the first threshold value and at least one additional threshold value, and wherein a number of controlled paths that are controlled to have minimum conductivity is dependent on a number of threshold values that are undercut by the sum of the current strengths.

7. The semiconductor arrangement of claim 1, wherein the current evaluation circuit comprises at least one current mirror circuit configured to mirror the current present in the controlled path or a signal representative of the current present in the controlled path.

8. The semiconductor arrangement of claim 1, wherein the semiconductor element is a transistor element.

9. A semiconductor arrangement comprising:
    a semiconductor element with a controlling path and a controlled path, the controlled path having a controllable conductivity;
    a current evaluation circuit configured to measure the current strength of a current present in the controlled path and to provide a signal representing the measured current strength, wherein the current evaluation circuit comprises at least one shunt resistor that provides a resistance and is connected in series with the controlled path, a voltage over the at least one shunt resistor represents the current present in the controlled path and the current evaluation circuit evaluates a voltage over the at least one shunt resistor; and a control circuit configured to control, in accordance with the signal representing the current strength, the resistance provided by the at least one shunt resistor.

10. The semiconductor arrangement of claim 9, wherein the shunt resistors are connected in series with the semiconductor elements and the voltages over the shunt resistors represent the currents flowing through the shunt resistors and the semiconductor elements, the voltages over the shunt resistors being evaluated by the current evaluation circuit.

11. The semiconductor arrangement of claim 10, wherein the current evaluation circuit is further configured to sum up the voltages over the shunt resistors and to provide an output signal representing the sum of the voltages over the shunt resistors.

12. The semiconductor arrangement of claim 10, wherein the current evaluation circuit comprises a circuit that is configured to adapt the signal that represents the current strength to be linear independent from a number of controlled paths that are controlled to have minimum conductivity.

13. The semiconductor arrangement of claim 10, wherein the shunt resistors are pieces of bonding wire.

14. The semiconductor arrangement of claim 9, further comprising at least one threshold value, wherein the current strength is compared to each of the at least one threshold value, and wherein the resistance provided by the at least one shunt resistor is dependent on a number of threshold values that are undercut by the current strength.

15. The semiconductor arrangement of claim 9, wherein the current evaluation circuit comprises at least one current mirror circuit configured to mirror the current present in the controlled path or a signal representative of the current present in the controlled path.

16. The semiconductor arrangement of claim 9, wherein the semiconductor element is a transistor element.

17. A method configured to measure the current through a semiconductor arrangement that comprises a multiplicity of semiconductor elements with controlling paths and controlled paths, the controlled paths having controllable conductivities and being connected parallel to each other, the method comprising:

measuring current strengths of currents present in the controlled paths and providing a signal representing the sum of the measured current strengths; and controlling the conductivities of the controlled paths in accordance with an input signal and a signal representing the sum of the current strengths, wherein at least one controlled path is controlled to have minimum conductivity if the signal representing the sum of the current strengths is below a threshold value.

18. The method of claim 17, wherein shunt resistors are connected in series with the controlled paths and the voltages at the shunt resistors represent the currents present in the controlled paths, the method further comprising summing up the voltages over the shunt resistors and providing an output signal representing the sum of the voltages over the shunt resistors.

19. The method of claim 18, further comprising adapting the signal that represents the sum of the current strengths to be linear independent from the number of controlled paths that are controlled to have minimum conductivity.

20. The method of claim 17, wherein the threshold value is a first threshold value, wherein the sum of the current strengths is compared to the first threshold value and at least one additional threshold value, and wherein a number of controlled paths that are controlled to have minimum conductivity is dependent on a number of threshold values that are undercut by the sum of the current strengths.

21. A method configured to measure the current through a semiconductor arrangement that comprises a semiconductor element with a controlling path and a controlled path, the controlled path having a controllable conductivity, wherein at least one shunt resistor provides a resistance and is connected in series with the controlled path and wherein a voltage over the at least one shunt resistor represents the current present in the controlled path, the method comprising:

measuring the current strength of a current present in the controlled path and providing a signal that represents the measured current strength by evaluating a voltage over the at least one shunt resistor; and controlling, in accordance with the signal representing the current strength, the resistance provided by the at least one shunt resistor.

22. The method of claim 21, wherein the shunt resistors are connected in series with the semiconductor elements and the voltages over the shunt resistors represent the currents flowing through the shunt resistors and the semiconductor elements, the method further comprising summing up the voltages over the shunt resistors and providing an output signal representing the sum of the voltages over the shunt resistors.

23. The method of claim 21, further comprising at least one threshold value, wherein the current strength is compared to each of the at least one threshold value, and wherein the number of controlled paths that are controlled to have minimum conductivity is dependent on the number of thresholds that are undercut by the sum of the current strengths.

24. The method of claim 22, further comprising adapting the signal that represents the sum of the current strengths to be linear independent from the number of controlled paths that are controlled to have minimum conductivity.

* * * * *